United States Patent [19]
Calafato et al.

[11] Patent Number: 6,064,594
[45] Date of Patent: May 16, 2000

[54] VOLTAGE BOOSTING CIRCUIT FOR GENERATING BOOSTED VOLTAGE PHASES

[75] Inventors: Carmela Calafato, Milazzo; Maurizio Gaibotti, Cesano Maderno, both of Italy

[73] Assignee: STMicroelectronics S.r.l., Agrate Brianza, Italy

[21] Appl. No.: 09/258,224

[22] Filed: Feb. 26, 1999

[51] Int. Cl.$^7$ .................................................. G11C 7/00
[52] U.S. Cl. .............................. 365/185.11; 365/185.25; 327/589
[58] Field of Search .................. 365/189.11, 189.09, 365/185.25; 327/390, 536, 537, 589

[56] References Cited

U.S. PATENT DOCUMENTS

| | | | |
|---|---|---|---|
| 5,404,329 | 4/1995 | Yamagata et al. | 365/185.11 |
| 5,521,871 | 5/1996 | Choi | 365/185.11 |
| 5,608,677 | 3/1997 | Yoon et al. | 365/185.11 |

*Primary Examiner*—Tan T. Nguyen
*Attorney, Agent, or Firm*—Theodore E. Galanthay; Fleit, Kain, Gibbons, Gutman & Bongini P.L.

[57] ABSTRACT

A voltage boosting circuit for use in an integrated circuit having at least four driving voltage phases that include first and second voltage phases with amplitudes substantially equal to the supply voltage, and first and second boosted voltage phases. The voltage boosting circuit includes an input that receives the first or second voltage phase, an output that supplies the first or second boosted voltage phase, and a charge node that is coupled to the input. Additionally, a supply voltage precharge circuit precharges the charge node, and an additional transistor is connected between the supply voltage and the charge node. The additional transistor is driven by a voltage with a greater amplitude than the supply voltage so that the charge node is precharged up to the supply voltage and the first or second boosted voltage phase that is output by the voltage boosting circuit reaches an amplitude equal to substantially twice the supply voltage. In one preferred embodiment, the additional transistor is an N-channel transistor, the voltage that drives the additional transistor is the second boosted voltage phase, and the first boosted voltage phase is supplied at the output of the voltage boosting circuit.

16 Claims, 6 Drawing Sheets

VOLTAGE BOOSTING CIRCUIT FOR GENERATING BOOSTED VOLTAGE PHASES

CROSS-REFERENCE TO RELATED APPLICATIONS

This application is based upon and claims priority from prior Italian Patent Application No. TO-98-A000166, filed Feb. 27, 1998, the entire disclosure of which is herein incorporated by reference.

Additionally, this application is related to the applications "LOW CONSUMPTION BOOSTED VOLTAGE DRIVING CIRCUIT" and "VOLTAGE PHASE GENERATOR WITH INCREASED DRIVING CAPACITY", which were filed on the same day as the present application and commonly assigned herewith to STMicroelectronics S.r.l. These related applications are herein incorporated by reference.

BACKGROUND OF THE INVENTION

1. Field of the Invention

The present invention relates to semiconductor memory devices, and more specifically to a voltage boosting circuit for generating voltage phases with boosted voltages in a memory device.

2. Description of Related Art

Integrated circuits, and especially memory circuits, often require voltages of different values. The main voltage is the circuit supply voltage (typically 5 V, 3.3 V, or 1.8 V), and higher voltages can be derived from the supply voltage. A boosted voltage is defined as a voltage produced within the integrated circuit with a higher value than the supply voltage itself. Typically, the voltages derived from the main voltage and boosted above the main voltage are not available during the entire operating time of the integrated circuit, but are made available only during predetermined time periods.

Therefore, the boosted voltages take the form of substantially square-wave voltage signals, such as clock signals. Such signals are commonly defined as voltage phases or simply phases (similar to the phases of polyphase voltage circuits) because multiple voltage signals with the same amplitude but different phase shifts are generated. As a result, there are normal voltage phases (i.e., having a square wave with an amplitude equal to the supply voltage) and boosted voltage phases that are identified by a greater voltage amplitude.

Voltage phase generators that produce boosted voltage phases are used in integrated circuits (e.g., to drive booster circuits requiring a high efficiency) mainly with reference the charge transfer from one stage to another. For this purpose. voltage phase generators should be able to output a plurality of voltage signals with different amplitudes and voltage phases. Typically, four voltage phases are provided: two phases FX and FN with an amplitude equal to the supply voltage VDD, and two phases FBX and FBN with boosted voltage that are produced by a voltage boosting circuit (a "bootstrap") from the voltage phases FX and FN, respectively. The voltage phases FX and FN and the voltage phases FBX and FBN are in phase opposition to each other.

FIG. 1a shows a schematic diagram of a conventional booster circuit. The booster circuit 1 has two stages S1 and S2 that receive a supply voltage signal at an input IN and supply a boosted voltage signal from an output OUT. The booster circuit 1 can have several stages for subsequent voltage boosting up to the desired value. The booster circuit 1 is substantially driven by the four voltage phases or clock signals (i.e., two phases FX and FN with an amplitude equal to the supply voltage VDD and two boosted voltage phases FBX and FBN). The boosted voltage phases are obtained from the normal voltage phases FX and FN through the use of a voltage phase generator that contains a voltage boosting or bootstrap circuit. (The voltage phase generator and the voltage boosting circuit are described below with reference to FIG. 1b and FIG. 3.)

The normal voltage phases FX and FN are in phase opposition to each other, as are the two boosted voltage phases FBX and FBN. The booster circuit 1 uses the positive transition of the normal voltage phase FX having an amplitude equal to the supply voltage VDD to raise the voltage on node A up to the value of the supply voltage VDD (i.e., by charging node A through a capacitor CX). The subsequent positive transition of the boosted voltage phase FBX puts transistor M1 in conduction to allow charge transfer from node A to node B. Transistor M1 is driven through the boosted voltage phase FBX by another capacitor CBX. The boosted voltage phase FBX has a higher voltage than the supply voltage VDD so as to prevent a voltage drop across transistor M1 due to the threshold voltage of transistor M1. From node B to the output OUT, there is analogous behavior driven by the normal voltage phase FN and the boosted voltage phase FBN, whose phase opposition will subsequently complete charge transfer from node B to the output OUT.

FIG. 1b shows a voltage phase generator circuit 4 connected to the booster circuit 1 of FIG. 1a. As shown, the voltage phase generator circuit 4 includes a bistable latch LTH that is driven by signals ST1 and ST2 to supply normal voltage phases FX and FN. The boosted voltage phases FBX and FBN are obtained using suitable voltage boosting circuits 2 that receive the normal voltage phases FX and FN and the clock signals CK and CKN of the integrated circuit. The clock signals clock the boosted voltage phases FBX and FBN. FIG. 2 shows timing diagrams of the normal voltage phases FX and FN and the boosted voltage phases FBX and FBN.

FIG. 3 shows a conventional voltage boosting circuit for generating the boosted voltage phases FBX and FBN. As shown, the voltage boosting circuit 2 includes a precharge transistor DP1 that is connected between the supply voltage VDD and a charge node H. The charge mode H receives the voltage phase FX through a capacitor C. The purpose of the capacitor C (like the previous ones) is to raise the voltage on the connected node (i.e., the charge node H) during the positive transition of the voltage phase (i.e., the voltage phase FX). Therefore, a P-channel MOS charge transfer transistor P1 driven by the voltage phase FN is provided between the charge node H and an output FBX_OUT. Additionally, the voltage phase FN drives an N-channel discharge transistor N1 that allows the output FBX_OUT to discharge during the negative transitions of the voltage phase FX.

The precharge transistor DP1 allows precharging of the charge node H only up to the value VDD-VT, where VT is the threshold voltage of the precharge transistor DP1. A subsequent switch-in of the voltage phase FX brings the boosted voltage phase FBX at the output FBX_OUT to the maximum attainable value of 2VDD-VT. FIG. 4 shows the normal voltage phase FX and boosted voltage phase FBX that are produced by the voltage boosting circuit of FIG. 3. The conventional voltage phase generator circuit described above has the drawback of supplying boosted voltage phases with a voltage amplitude that is restricted to 2VDD-VT. This specifically limits the charge transfer speed of the booster circuit stages.

SUMMARY OF THE INVENTION

In view of these drawbacks, it is an object of the present invention to overcome the above-mentioned drawbacks and to provide a voltage boosting circuit having a more efficient and improved performance.

Another object of the present invention to provide a voltage boosting circuit that supplies boosted voltage phases with a greater amplitude than is attainable with conventional circuits.

Yet another object of the present invention is to provide a voltage boosting circuit that eliminates the threshold voltage drop of the precharge transistor.

One embodiment of the present invention provides a voltage boosting circuit for use in an integrated circuit having at least four driving voltage phases that include a first voltage phase with an amplitude substantially equal to a supply voltage, a second voltage phase with an amplitude substantially equal to the supply voltage and substantially in phase opposition to the first voltage phase, a first boosted voltage phase, and a second boosted voltage phase substantially in phase opposition to the first boosted voltage phase. The voltage boosting circuit includes an input that receives the first or second voltage phase, an output that supplies the first or second boosted voltage phase, and a charge node that is coupled to the input. Additionally a supply voltage precharge circuit precharges the charge node, and an additional transistor is connected between the supply voltage and the charge node. The additional transistor is driven by a voltage with a greater amplitude than the supply voltage so that the charge node is precharged up to the supply voltage and the first or second boosted voltage phase that is output by the voltage boosting circuit reaches an amplitude equal to substantially twice the supply voltage. In a preferred embodiment the additional transistor is an N-channel transistor, the voltage that drives the additional transistor is the second boosted voltage phase, and the first boosted voltage phase is supplied at the output of the voltage boosting circuit.

Another embodiment of the present invention provides a booster circuit of the type that uses at least four driving voltage phases including a first voltage phase with an amplitude substantially equal to a supply voltage, a second voltage phase with an amplitude substantially equal to the supply voltage and substantially in phase opposition to the first voltage phase, a first boosted voltage phase, and a second boosted voltage phase substantially in phase opposition to the first boosted voltage phase. The booster circuit includes at least two stages and a voltage phase generator. Further, each of the stages includes a first transistor and a charge transfer transistor that is connected between a stage input and a stage output, and one of the boosted voltage phases is coupled to the stage input through the first transistor and to the gate of the charge transfer transistor. The voltage phase generator includes at least two voltage boosting circuits that supply the first and second boosted voltage phases, and the boosted voltage phases have an amplitude that is substantially double the amplitude of the supply voltage. In one preferred embodiment, each of the voltage boosting circuits includes a transistor connected between the supply voltage and a charge node of the voltage boosting circuit, with the transistor being driven by one of the boosted voltage phases and the other of the boosted voltage phases being supplied at an output of the voltage boosting circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1b a schematic diagram of a voltage phase generator connected to the booster circuit of FIG. 1a;

DETAILED DESCRIPTION OF PREFERRED EMBODIMENTS

Preferred embodiments of the present invention will be described in detail hereinbelow with reference to the attached drawings.

Figure 5:
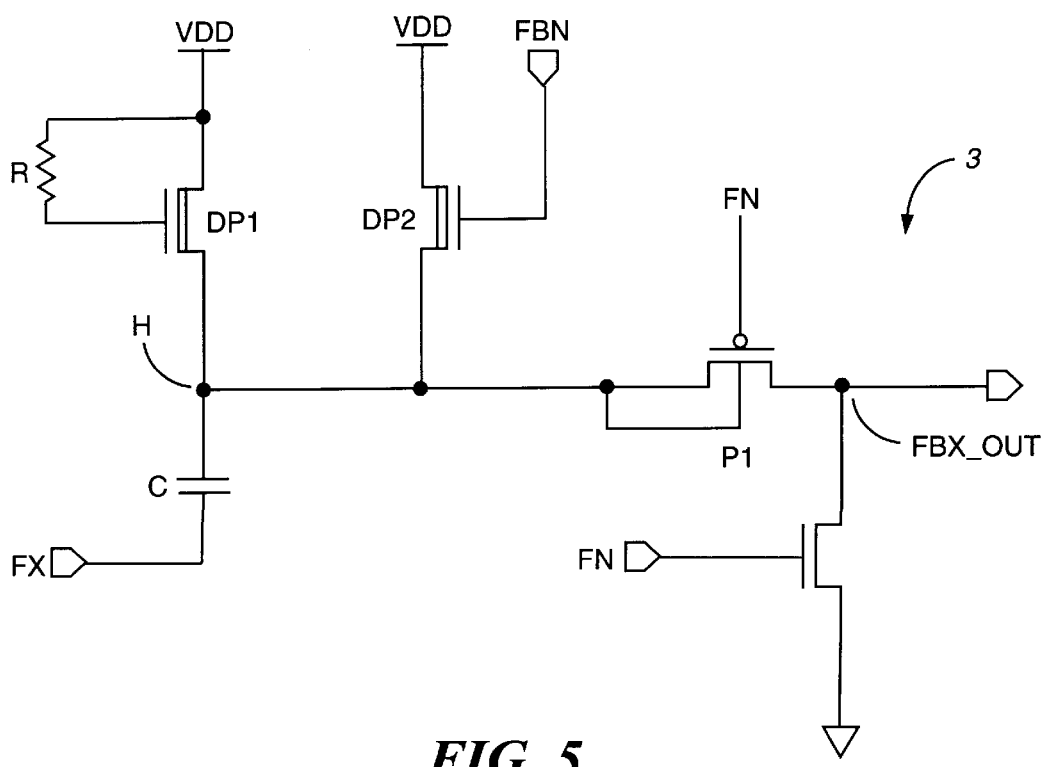
FIG. 5 shows a schematic diagram of a voltage boosting circuit according to a preferred embodiment of the present invention.

In order to increase the amplitude of the boosted voltage phases FBX or FBN, preferred embodiments of the present invention provide an additional transistor that is driven by a boosted voltage (e.g., the boosted voltage in phase opposition). A voltage boosting circuit according to a preferred embodiment of the present invention is shown in FIG. 5. As shown, the voltage boosting circuit 3 generates the boosted voltage phase FBX from the normal voltage phase FX. Additionally, a dual circuit using voltage phases in phase opposition can be used to similarly generate the other boosted voltage phase FBN, which is in phase opposition to the boosted voltage phase FBX.

Figure 3:
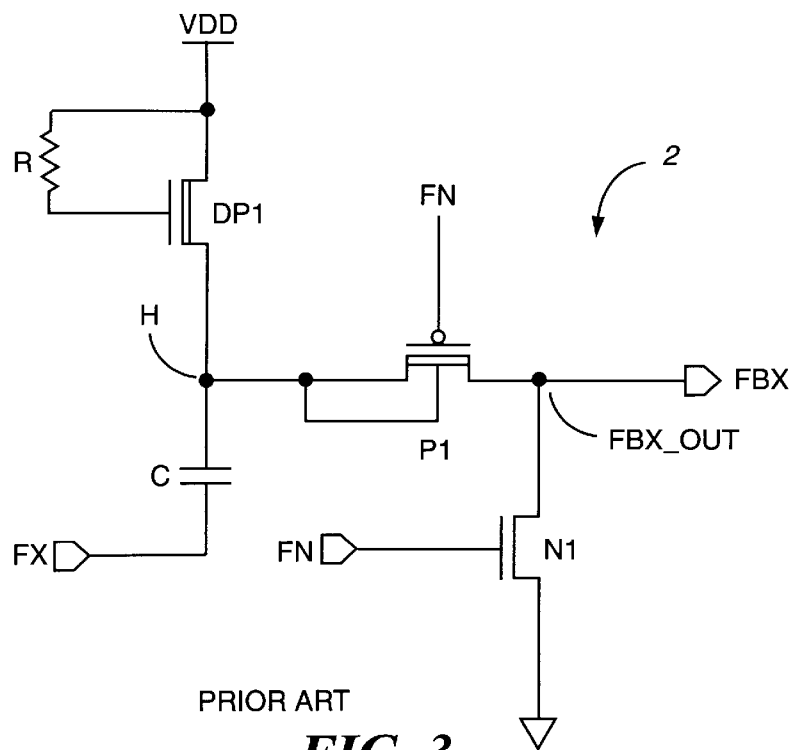
FIG. 3 shows a schematic diagram of a conventional voltage boosting circuit.

The circuit of FIG. 5 differs from the circuit of FIG. 3 by the presence of an additional transistor DP2 that is connected between the supply voltage VDD and the charge node H. The additional transistor DP2 is driven by the boosted voltage phase FBN to allow precharging of node H up to the supply voltage VDD. Thus, the other boosted voltage phase FBX (i.e., the phase generated by the voltage boosting circuit 3) will reach an amplitude equal to twice the value of VDD. In other words, using the voltage boosting circuit 3 of FIG. 5, the threshold voltage of transistor DP1 that precharges node H no longer affects the output (as it did in the circuit of FIG. 3) because transistor DP2 is driven through a boosted voltage phase FBN whose amplitude removes the threshold voltage effect.

The above-described operation corresponds to steady operation. When starting the voltage boosting circuit 3, the boosted voltage FBN may initially take a lower amplitude (e.g., 2VDD-VT as supplied by the boosting circuit of FIG.

3). Regardless, such an amplitude is enough to eliminate a drop on transistor DP1 and bring the boosted voltage phases FBX and FBN to an amplitude of 2VDD within a few cycles of the voltage phases FX and FBX.

Figure 4:
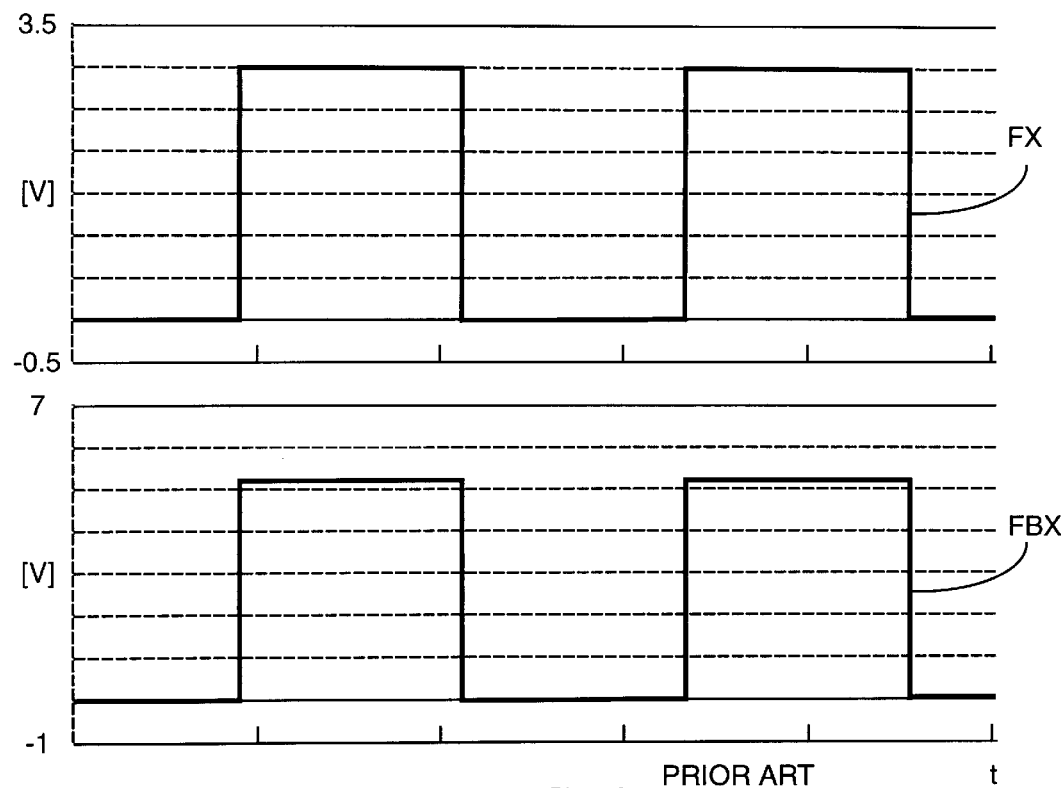
FIG. 4 shows a timing diagram of voltages generated by the voltage boosting circuit of FIG. 3.
Figure 6:
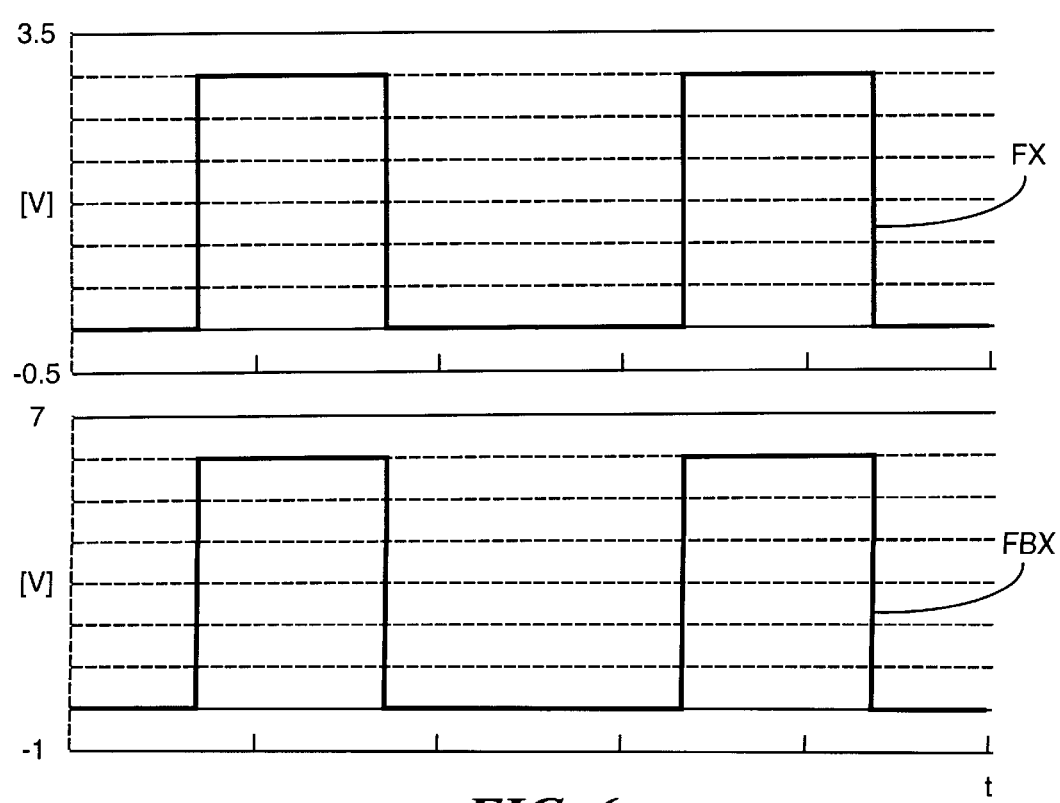
FIG. 6 shows a timing diagram of voltages generated by the voltage boosting circuit of FIG. 5.

The lower portion of FIG. 6 shows the voltage phase FBX that is produced by the voltage boosting circuit of FIG. 5. Comparing this voltage phase with the voltage phase FBX produced by the circuit of FIG. 3 (as shown in the lower portion of FIG. 4), it can be seen that the amplitude of the voltage phase FBX produced by the voltage boosting circuit of FIG. 5 is about 0.7 volts greater than that produced by the voltage boosting circuit of FIG. 3. This value corresponds to the value of one threshold voltage. This greater amplitude for the boosted voltage phases allows an improved efficiency for the booster circuit that is being driven by these phases, as shown in FIGS. 7 and 8.

Figure 7:
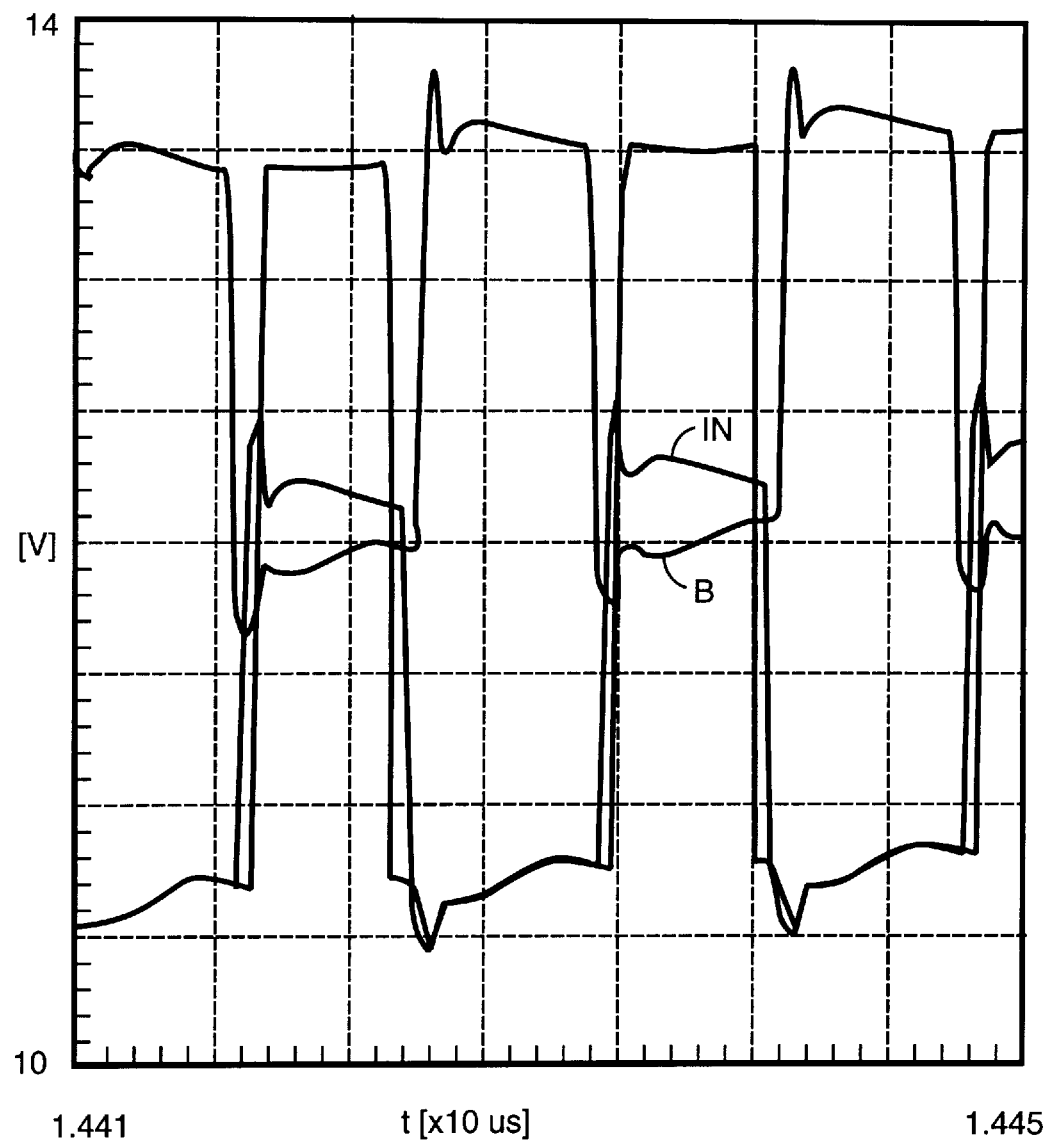
FIG. 7 rows a timing diagram of voltages related to the booster circuit of FIG. 1a when associated with the conventional voltage boosting circuit of FIG. 3.

FIG. 7 shows the amplitudes of the voltage phases detected at the booster circuit 1 nodes when driven by a boosted voltage phase generator circuit that includes a voltage boosting circuit 2 similar to the one shown in FIG. 3. FIG. 8 shows the amplitudes of the voltage phases detected at the booster circuit 1 nodes when driven by a boosted voltage phase generator circuit that includes the voltage boosting circuit 3 of the present invention. In particular, both FIGS. 7 and 8 show the voltage amplitudes detected at three nodes of the booster circuit 1 (starting from below): input node IN (or node A), intermediate node B, and output node OUT.

Figure 1A:
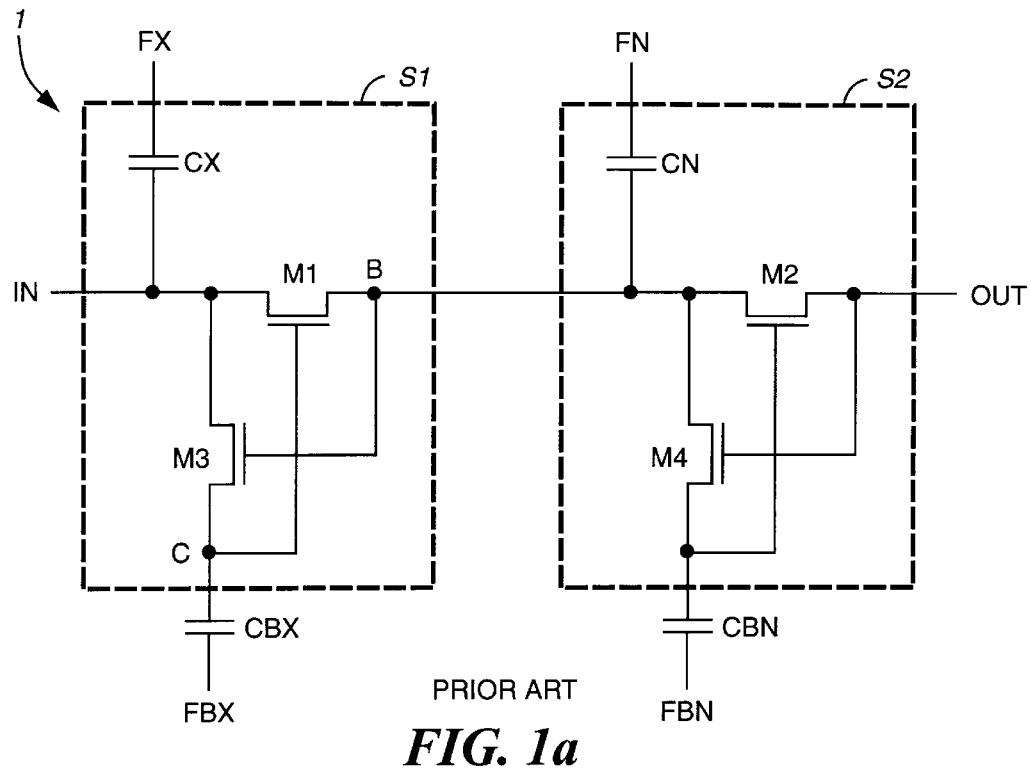
FIG. 1a shows a schematic diagram of a conventional booster circuit.
Figure 1B:
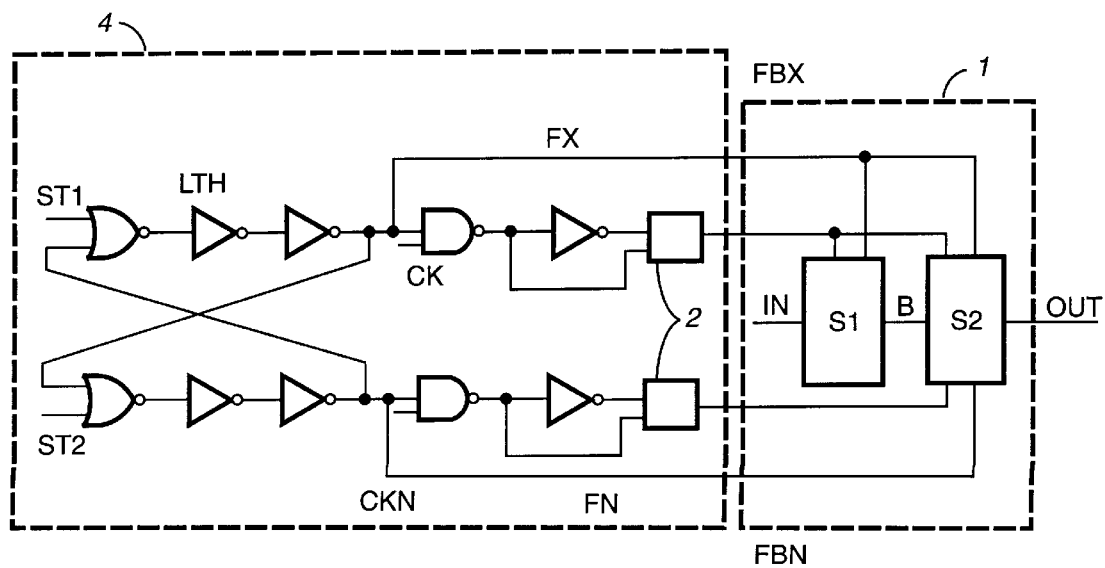
Figure 2:
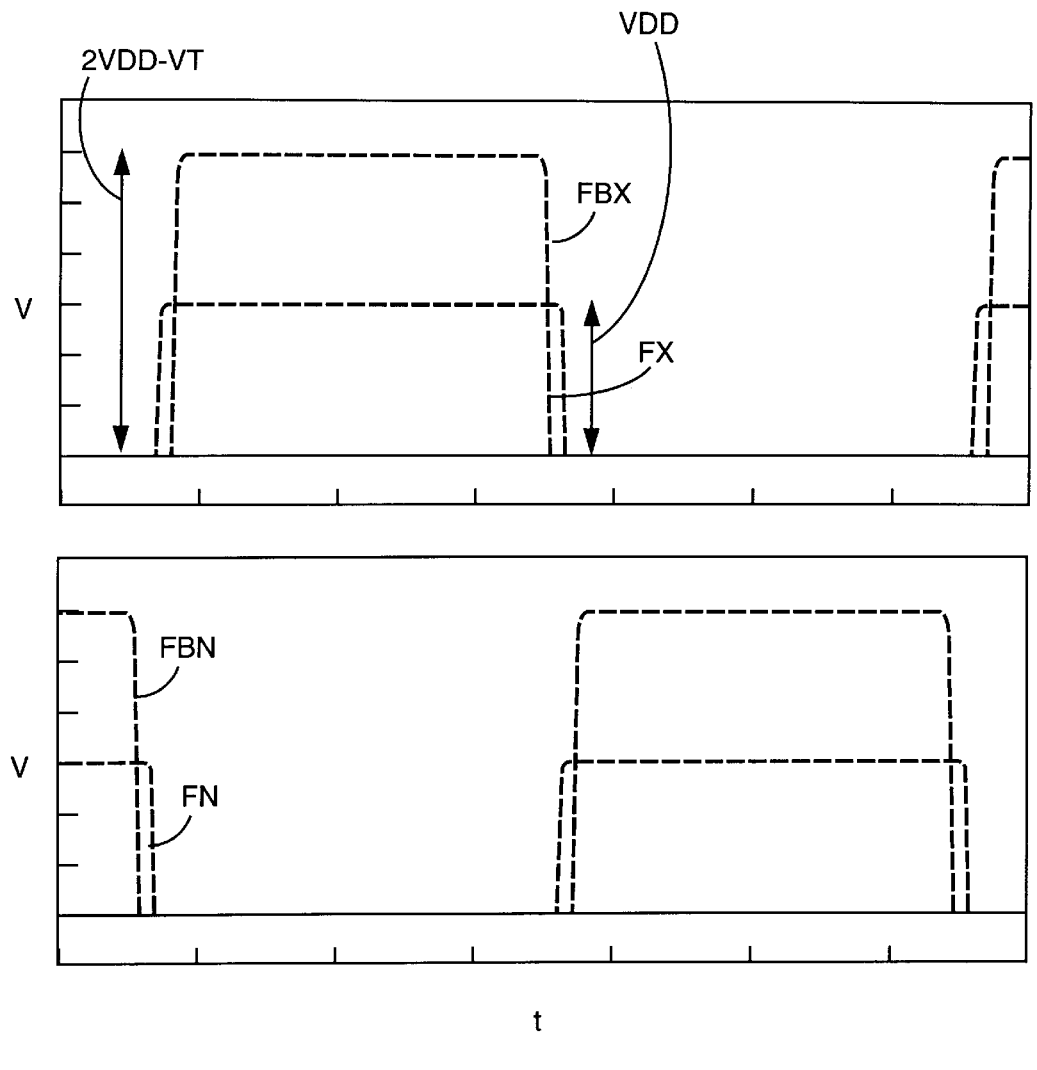
FIG. 2 shows a timing diagram of the voltage phases generated by a conventional voltage phase generator.
Figure 8:
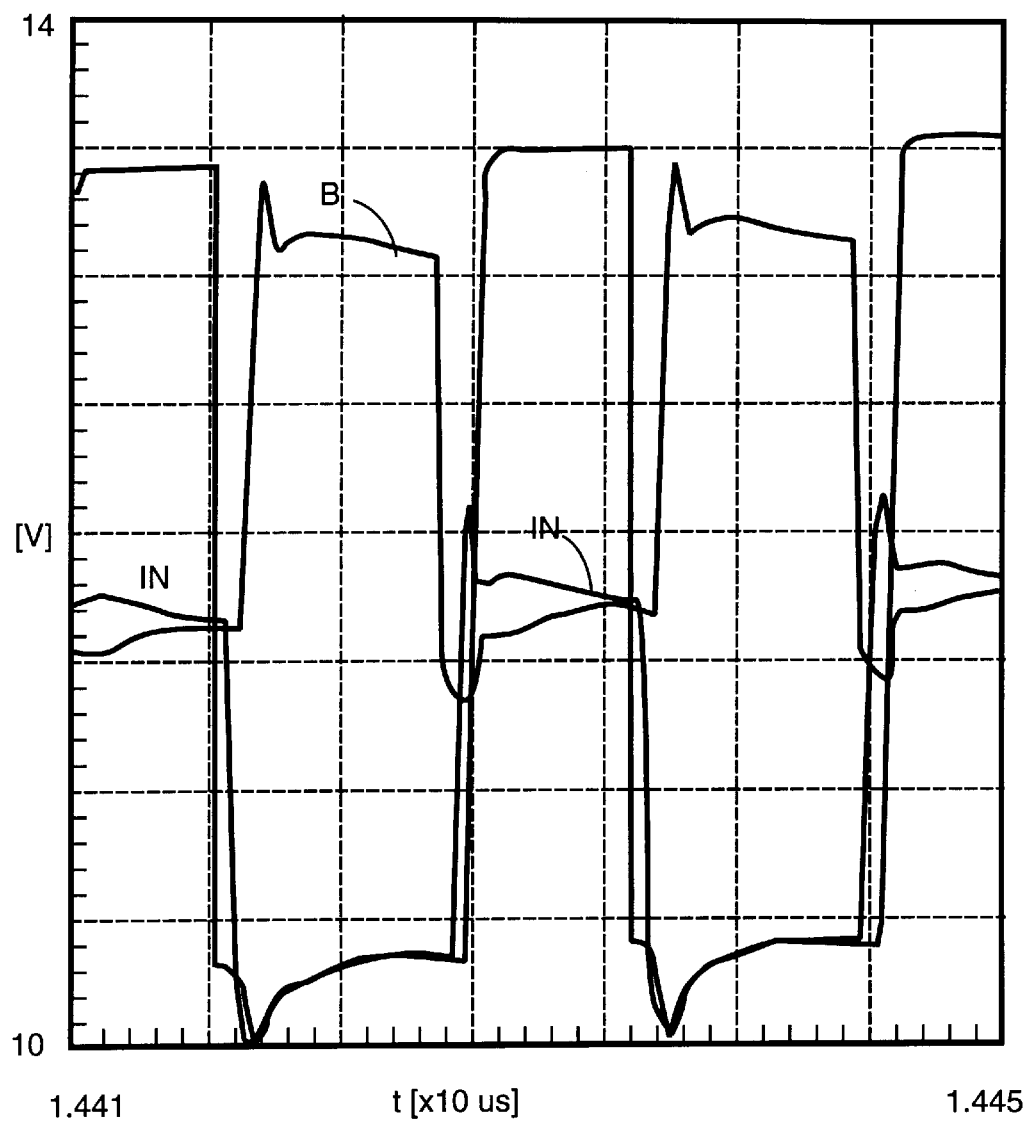
FIG. 8 shows a timing diagram of voltages related to the booster circuit of FIG. 1a when associated with the voltage boosting circuit of FIG. 5.

FIG. 8 shows that nodes IN and B of the booster circuit are able to reach the same voltage value because a complete charge transfer from one stage to the other is obtained by driving the transistor M1 of FIG. 1a with the greater amplitude boosted voltage phase FBX that is produced by the voltage boosting circuit of FIG. 5. When compared with FIG. 8, FIG. 7 shows that the conventional voltage boosting circuit of FIG. 3 makes charge transfer less quickly, and that node B does not reach the voltage value of node IN steadily before the start of the falling edge of the voltage.

Accordingly, the voltage boosting circuit of the present invention produces boosted voltage phases with greater amplitude and avoids problems associated with the threshold voltage drop of the precharge transistor. Further, the use of the voltage boosting circuit of the present invention along with a booster circuit advantageously allows driving voltage phases with the maximum voltage amplitude, and thus prevents problems caused by a threshold voltage drop on the transistors of the voltage boosting circuit. On the contrary, a more limited amplitude for the boosted voltage phases would prevent complete charge transfer from one booster stage to the next. Thus, boosted voltage phases with a greater amplitude allow charge transfers from one stage to another for faster (i.e., complete) boosters. As a result, high performance booster circuits can be formed by using voltage boosting circuits according to the present invention.

The voltage boosting circuit of the present invention is specially suited for use in integrated circuits, especially in non-volatile memory devices such as EPROM or EEPROM memories. However, the voltage boosting circuit of the present invention can also be applied jointly with other circuits that do not necessarily need to operate as boosters. The use in a booster circuit is simply one preferred application of the present invention.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A voltage boosting circuit for use in an integrated circuit of the type having at least four driving voltage phases, the voltage phases including a first voltage phase with an amplitude substantially equal to a supply voltage, a second voltage phase with an amplitude substantially equal to the supply voltage and substantially in phase opposition to the first voltage phase, a first boosted voltage phase, and a second boosted voltage phase substantially in phase opposition to the first boosted voltage phase, said voltage boosting circuit comprising:

an input receiving the first or second voltage phase;

an output supplying the first or second boosted voltage phase;

a charge node coupled to the input;

a supply voltage precharge circuit for precharging the charge node; and an additional transistor connected between the supply voltage and the charge node, wherein the additional transistor is driven by a voltage with a greater amplitude than the supply voltage so that the charge node is precharged up to the supply voltage and the first or second boosted voltage phase that is output by the voltage boosting circuit reaches an amplitude equal to substantially twice the supply voltage.

2. The voltage boosting circuit as defined in claim 1, wherein the additional transistor is an N-channel transistor, the voltage with a greater amplitude than the supply voltage that drives the additional transistor is the second boosted voltage phase, and the first boosted voltage phase is supplied at the output of the voltage boosting circuit.

3. The voltage boosting circuit as defined in claim 1, wherein the voltage with a greater amplitude than the supply voltage that drives the additional transistor is the first or second boosted voltage phase.

4. The voltage boosting circuit as defined in claim 1, further comprising a transfer transistor connected between the charge node and the output, the transfer transistor being driven by the second voltage phase.

5. The voltage boosting circuit as defined in claim 1, wherein the voltage boosting circuit is integrated in a non-volatile memory device.

6. A voltage boosting circuit comprising:

an output node supplying a first boosted voltage phase;

a charge node receiving a first normal voltage phase;

a supply voltage precharge circuit for precharging the charge node, the supply voltage precharge circuit being connected between the supply voltage and the charge node; and an additional transistor connected between the supply voltage and the charge node, the additional transistor being driven by a second boosted voltage phase, which is in phase opposition to the first boosted voltage phase.

7. The voltage boosting circuit as defined in claim 6, further comprising a transfer transistor connected between the charge node and the output node, the transfer transistor being driven by a second normal voltage phase, which is in phase opposition to the first normal voltage phase.

8. The voltage boosting circuit as defined in claim 6 wherein the additional transistor is an N-channel transistor.

9. The voltage boosting circuit as defined in claim 6, wherein the voltage boosting circuit is integrated in a non-volatile memory device.

10. A booster circuit of the type that uses at least four driving voltage phases, the voltage phases including a first voltage phase with an amplitude substantially equal to a supply voltage, a second voltage phase with an amplitude substantially equal to the supply voltage and substantially in phase opposition to the first voltage phase, a first boosted voltage phase, and a second boosted voltage phase substantially in phase opposition to the first boosted voltage phase, said booster circuit comprising:

- at least two stages, each of the stages including a first transistor and a charge transfer transistor that is connected between a stage input and a stage output one of the first and second boosted voltage phases being coupled to the stage input through the first transistor and to the gate of the charge transfer transistor; and
- a voltage phase generator including at least two voltage boosting circuits that supply the first and second boosted voltage phases, the boosted voltage phases having an amplitude that is substantially double the amplitude of the supply voltage.

11. The booster circuit as defined in claim 10, wherein each of the voltage boosting circuits includes a transistor connected between the supply voltage and a charge node of the voltage boosting circuit, the transistor being driven by one of the first and second boosted voltage phases and the other of the first and second boosted voltage phases being supplied at an output of the voltage boosting circuit.

12. The booster circuit as defined in claim 10, wherein the booster circuit is integrated in a non-volatile memory device.

13. memory device comprising:

- a memory array having memory cells arranged in rows and columns;
- word lines connected to the memory cells;
- bit lines connected to the memory cells; and
- a booster circuit for supplying a boosted voltage to the word lines or bit lines, the booster circuit including at least one voltage boosting circuit, wherein the voltage boosting circuit includes:
- an output node supplying a first boosted voltage phase;
- a charge node receiving a first normal voltage phase;
- a supply voltage precharge circuit for precharging the charge node, the supply voltage precharge circuit being connected between the supply voltage and the charge node; and
- an additional transistor connected between the supply voltage and the charge node, the additional transistor being driven by a second boosted voltage phase, which is in phase opposition to the first boosted voltage phase.

14. The memory device as defined in claim 13, wherein the voltage boosting circuit further includes a transfer transistor connected between the charge node and the output node, the transfer transistor being driven by a second normal voltage phase, which is in phase opposition to the first normal voltage phase.

15. The memory device as defined in claim 13, wherein the additional transistor is an N-channel transistor.

16. The memory device as defined in claim 13, wherein the memory device is a non-volatile memory device.

* * * * *